US012795825B2

(12) United States Patent
Ando et al.

(10) Patent No.: US 12,795,825 B2
(45) Date of Patent: Nov. 10, 2026

(54) WIRING SUBSTRATE

(71) Applicant: IBIDEN CO., LTD., Ogaki (JP)

(72) Inventors: Ryo Ando, Ogaki (JP); Nobuhisa Kuroda, Ogaki (JP); Shogo Fukui, Ogaki (JP); Kosei Ichikawa, Ogaki (JP); Makoto Kato, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 298 days.

(21) Appl. No.: 18/537,877

(22) Filed: Dec. 13, 2023

(65) Prior Publication Data

US 2024/0206061 A1 Jun. 20, 2024

(30) Foreign Application Priority Data

Dec. 14, 2022 (JP) ................................ 2022-199776

(51) Int. Cl.
*H05K 1/02* (2006.01)
*H05K 1/03* (2006.01)

(52) U.S. Cl.
CPC ......... *H05K 1/0373* (2013.01); *H05K 1/0298* (2013.01); *H05K 2201/0209* (2013.01); *H05K 2201/0254* (2013.01); *H05K 2201/0269* (2013.01)

(58) Field of Classification Search
CPC ............... H05K 1/0373; H05K 1/0298; H05K 2201/0269; H05K 2201/0254; H05K 2201/0209
See application file for complete search history.

(56) References Cited

U.S. PATENT DOCUMENTS

2013/0075138 A1* 3/2013 Yu ............................ C08K 3/26 174/257
2015/0305154 A1* 10/2015 Hayashi ............... H05K 1/0298 428/688

FOREIGN PATENT DOCUMENTS

JP 2006-045388 A 2/2006

* cited by examiner

*Primary Examiner* — Jeremy C Norris
(74) *Attorney, Agent, or Firm* — Finnegan, Henderson, Farabow, Garrett & Dunner, LLP

(57) ABSTRACT

A wiring substrate includes an insulating layer including a first layer and a second layer, and a conductor layer including a metal film formed on a surface of the second layer of the insulating layer such that the conductor layer includes a conductor pattern. The first layer includes resin and first inorganic particles, the second layer includes resin and second inorganic particles at the content rate that is lower than the content rate of the first inorganic particles in the first layer, and the thickness of the first layer is 90% or more of the thickness of the insulating layer. The second layer of the insulating layer includes a composite layer having the thickness in the range of 0.1 to 0.3 μm, and the composite layer includes part of the metal film in the conductor layer formed in gaps between the second inorganic particles and resin in the second layer.

20 Claims, 2 Drawing Sheets

WIRING SUBSTRATE

CROSS-REFERENCE TO RELATED APPLICATIONS

The present application is based upon and claims the benefit of priority to Japanese Patent Application No. 2022-199776, filed Dec. 14, 2022, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2006-45388 describes an insulating adhesive sheet containing inorganic filler particles. The entire contents of this publication are incorporated herein by reference.

SUMMARY OF THE INVENTION

According to one aspect of the present invention, a wiring substrate includes an insulating layer including a first layer and a second layer, and a conductor layer including a metal film formed on a surface of the second layer of the insulating layer such that the conductor layer includes a conductor pattern. The insulating layer is formed such that the first layer includes resin and first inorganic particles, that the second layer includes resin and second inorganic particles at the content rate that is lower than the content rate of the first inorganic particles in the first layer, and that the thickness of the first layer is 90% or more of the thickness of the insulating layer, and the second layer of the insulating layer is formed such that the second layer includes a composite layer portion having the thickness in the range of 0.1 μm to 0.3 μm and that the composite layer portion includes part of the metal film in the conductor layer formed in gaps between the second inorganic particles and the resin in the second layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
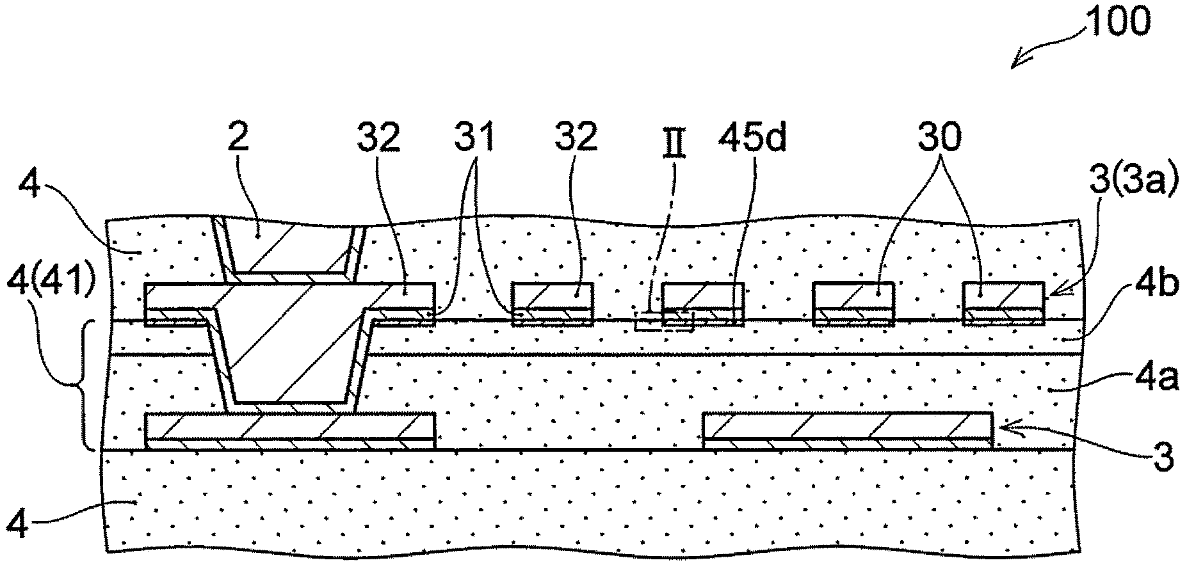
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
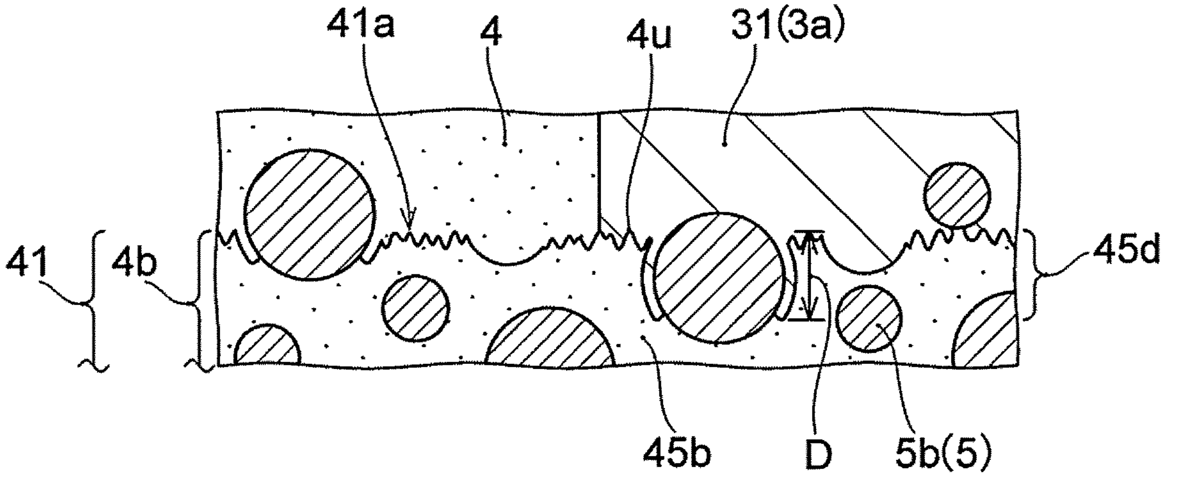
FIG. 2 is an enlarged view schematically illustrating an example of a cross section near an interface between an insulating layer and a metal film.

FIG. 1 is a cross-sectional view illustrating a part of a wiring substrate 100, which is an example of a wiring substrate according to an embodiment of the present invention. FIG. 2 illustrates an enlarged schematic view of a cross section near an interface between an insulating layer 4 and a conductor layer 3 (metal film 31) in the wiring substrate 100 (for example, a portion (II) in FIG. 1). The wiring substrate 100 is merely an example of the wiring substrate of the present embodiment. A laminated structure, the number of conductor layers, the number of insulating layers, and the like, of the wiring substrate of the embodiment can be suitably selected.

As illustrated in FIG. 1, the wiring substrate 100 includes insulating layers 4 and conductor layers 3 that are respectively formed on the insulating layers 4. In the embodiment illustrated in FIG. 1, the conductor layers 3 each have a two-layer structure. For example, the conductor layers 3 each include a lower layer formed of a metal film 31 formed on a surface of an insulating layer 4 and an upper layer formed of a plating film 32 formed on the metal film 31. Each of the insulating layers 4 includes via conductors 2 that penetrate the each of the insulating layers 4 and connects conductor layers 3 that are adjacent to each other via the each of the insulating layers 4 in a lamination direction of the insulating layers 4 and the conductor layers 3.

In the description of the wiring substrate 100 of the present embodiment, in a relationship between an insulating layer 4 and a conductor layer 3, a side on which the conductor layer 3 is laminated on a surface of the insulating layer 4, that is, an upper side on the drawing sheet, is referred to as an "upper side" or simply "upper," and the opposite side thereof is referred to as a "lower side" or simply "lower."

The conductor layers 3 each include predetermined conductor patterns. The conductor layers 3 may be formed of a conductive metal, for example, are formed of copper or nickel or the like. As described above, in the example of FIG. 1, the conductor layers 3 are each formed of a metal film 31 and a plating film 32. For example, the metal film 31 is an electroless plating film or a sputtering film. The plating film 32 is, for example, an electrolytic plating film. The metal film 31 has a thickness of, for example, about 0.1 μm or more and about 0.5 μm or less. The conductor layers 3 each have a thickness of, for example, about 3 μm or more and about 20 μm or less.

The via conductors 30 are each integrally formed with a conductor layer 3. Therefore, the via conductors 2 are formed of any metal such as copper or nickel, similar to the conductor layers 3, and each have a two-layer structure including a metal film 31 and a plating film 32, similar to the conductor layers 3.

As illustrated in FIG. 1, the wiring substrate 100 of the embodiment includes a conductor layer (3*a*) including multiple mutually adjacent wiring patterns 30 that have relatively small wiring widths and are formed at relatively small intervals. For example, the multiple wiring patterns 30 are formed according to a wiring rule of (5 μm)/(5 μm), regarding a wiring rule defined by a combination (L/S) of a minimum wiring width (L) and a minimum wiring interval (S). Therefore, the conductor layer (3*a*) can include the multiple wiring patterns 30 having a (minimum wiring width (L))/(minimum wiring interval (S)) of (5 μm)/(5 μm). For example, a minimum wiring width of wirings included in the wiring patterns 30 is about 5 μm or more and about 9 μm or less. A minimum interval between adjacent wirings included in the wiring patterns 30 is, for example, about 5 μm or more and about 12 μm or less.

When the wiring substrate 100 has the wiring patterns 30, it may be possible that the wiring substrate 100 can be reduced in size, and a narrow-pitch multi-terminal component can be mounted on the wiring substrate 100. Further, it is thought that it may be possible to improve a wiring density and to improve a degree of freedom in wiring design. The wiring patterns 30 can be provided in any one of the conductor layers 3 of the wiring substrate 100.

The insulating layers 4 can contain any insulating resin. Examples of the insulating resin include an epoxy resin, a bismaleimide triazine resin (BT resin), a phenol resin, and the like. The insulating layers may each contain a core material (reinforcing material) formed of a glass fiber or an aramid fiber. The insulating layers can each further contain inorganic filler particles 5 (not illustrated in the drawings) formed of fine particles of silica ($SiO_2$), alumina, mullite, or the like. The insulating layers 4 each have a thickness of, for example, about 10 μm or more and about 40 μm or less. Preferably, the insulating layers 4 each can have a thickness of about 30 μm.

As described above, the wiring substrate 100 of the embodiment includes the multiple wiring patterns 30 with small wiring widths and intervals, that is, the conductor layer (3*a*) including fine wirings. Among the insulating layers 4, at least an insulating layer 41 on a surface of which the conductor layer (3*a*) is formed contains multiple inorganic filler particles 5. As illustrated in FIG. 1, the insulating layer 41 has a two-layer structure (including a first layer (4*a*) and a second layer (4*b*)). The first layer (4*a*) covers an exposed surface of a conductor layer 3 formed on a surface of a lower-side insulating layer 4 and a surface of the lower-side insulating layer 4 that is not covered by the conductor layer 3. The second layer (4*b*) is formed on the first layer (4*a*). The metal film 31 that forms the lower layer of the conductor layer (3*a*) is formed on the second layer (4*b*).

For example, a thickness of the first layer (4*a*) is about 90% or more and 97% or less of a total thickness of the insulating layer 41. Preferably, the thickness of the first layer (4*a*) can be about 90% or more of the total thickness of the insulating layer 41. It is thought that, when the thickness of the first layer (4*a*) is at this level, as will be described later, a low dielectric loss tangent for the entire insulating layer 41 is achieved. That is, it is thought that, by forming the first layer (4*a*), which forms about 90% of the insulating layer 41, with a low transmission loss material, a low dielectric tangent for the insulating layer 41 can be achieved.

The insulating layer 41 contains the multiple inorganic filler particles 5 (see FIG. 3) and a resin part 45 (see FIG. 3) surrounding the multiple inorganic filler particles 5. The resin part 45 contains as a main component an epoxy resin, a BT resin, a phenol resin, or the like exemplified above as the resin forming the insulating layers 4. It may be possible that by adding the inorganic filler particles 5 formed of silica, alumina, or the like to the resin, mechanical strength and/or thermal conductivity of the insulating layer 41 can be increased. Further, it may be possible that by adjusting an additive amount of the inorganic filler particles 5, a thermal expansion coefficient of the insulating layer 41 can be adjusted.

In the wiring substrate 100 of the present embodiment, the multiple inorganic filler particles 5 include first inorganic filler particles (5*a*) and second inorganic filler particles (5*b*). The first inorganic filler particles (5*a*) are inorganic filler particles included in the first layer (4*a*) of the insulating layer 41. The second inorganic filler particles (5*b*) are inorganic filler particles included in the second layer (4*b*) of the insulating layer 41. That is, the first layer (4*a*) contains the multiple first inorganic filler particles (5*a*) and the resin part 45 (a first resin part (45*a*)) surrounding the multiple first inorganic filler particles (5*a*). The second layer (4*b*) contains the multiple second inorganic filler particles (5*b*) and the resin part 45 (a second resin part (45*b*)) surrounding the multiple second inorganic filler particles (5*b*).

As described above, the thickness of the first layer (4*a*) can be about 90% or more of the total thickness of the insulating layer 41. Therefore, for example, when the thickness of the insulating layer 41 is about 30 μm as described above, the thickness of the first layer (4*a*) can be about 27 μm or more. In FIG. 2, the inorganic filler particles 5 are drawn as each having a perfect spherical shape. However, the inorganic filler particles 5 can each have any shape. Particle sizes of the first inorganic filler particles (5*a*) included in the first layer (4*a*) are, for example, about 0.3 μm-3 μm. Preferably, an average particle size of the first inorganic filler particles (5*a*) can be about 0.3 μm. A content rate of the multiple first inorganic filler particles (5*a*) in the first layer (4*a*) is, for example, 70% or more and 95% or less. It is thought that when the first inorganic filler particles (5*a*) having the above-described particle sizes are present in the first layer (4*a*) at such a content rate, functions such as reduction in transmission loss and in delay speed are properly exhibited.

Therefore, the thickness of the second layer (4*b*) can be about 10% or less of the total thickness of the insulating layer 41. For example, the thickness of the second layer (4*b*) can be about 1 μm or more and about 3 μm or less. The second layer (4*b*) contains the second inorganic filler particles (5*b*). Particle sizes of the second inorganic filler particles (5*b*) are, for example, about 0.1 μm-1 μm. Preferably, an average particle size of the second inorganic filler particles (5*b*) can be about 0.1 μm. A content rate of the multiple second inorganic filler particles (5*b*) in the second layer (4*b*) is smaller than the content rate of the multiple first inorganic filler particles (5*a*) in the first layer (4*a*). The content rate of the multiple second inorganic filler particles (5*b*) in the second layer (4*b*) is, for example, 40% or more and 65% or less.

FIG. 2 illustrates an enlarged view of the embodiment of the second layer (4*b*) of the insulating layer 41 and the metal film 31 of the conductor layer (3*a*) formed on the insulating layer 41, corresponding to a portion (II) illustrated in FIG. 1. The second layer (4*b*) contains the multiple second inorganic filler particles (5*b*) and the second resin part (45*b*) surrounding the multiple second inorganic filler particles (5*b*).

As illustrated in FIG. 2, a surface (41*a*) of the insulating layer 41 (a surface of the second layer (4*b*)) has fine unevenness (4*u*). For example, the unevenness (4*u*) that provides a predetermined surface roughness is formed by subjecting the surface (41*a*) to a roughening treatment using a chemical method such as exposing the surface (41*a*) to a processing solution such as an alkaline permanganate solution. The unevenness (4*u*) may be formed by peeling off some of the multiple inorganic filler particles 5 (second inorganic filler particles (5*b*)) exposed on the surface (41*a*) of the insulating layer 41 with the roughening treatment. When the surface (41*a*) of the insulating layer 41 has such a fine unevenness (4*u*), the metal film 31 formed on the surface (41*a*) of the insulating layer 41 can be anchored onto the insulating layer 41 by an anchoring effect. It is thought that adhesion strength between the metal film 31 and the insulating layer 41 is improved.

Specifically, in the present embodiment, the surface (41*a*) of the insulating layer 41 can have an arithmetic mean roughness (Ra) of 0.05 μm or more and 0.15 μm or less. When the surface (41*a*) of the insulating layer 41 has such a small surface roughness, unwanted portions of the metal film 31 formed on the surface (41*a*) (portions that do not form the conductor patterns of the conductor layer (3*a*)) can be easily removed as intended in a manufacturing process of the conductor layer (3*a*). That is, since a deep recess that makes removal of the metal film 31 formed therein difficult is unlikely to exist on the surface (41*a*), the unwanted portions of the metal film 31 can be appropriately removed by, for example, etching. Therefore, insulation between the conductor patterns (for example, the wiring patterns 30 and the like) of the conductor layer (3*a*) is unlikely to deteriorate, and a short circuit failure is unlikely to occur. Further, since an etching time is short, an etching amount is small, and it is thought that, even when the conductor layer (3*a*) that includes fine wirings is formed, tinning of the wiring patterns 30 due to etching is unlikely to occur. It is thought that both effects of achieving a function of lowering the dielectric loss tangent for the entire insulating layer 41 by the first layer (4*a*) and achieving a low roughness of the surface (41*a*) of the insulating layer 41 for forming fine wirings can be realized.

The second inorganic filler particles (5*b*) contained in the second layer (4*b*) may each include a portion exposed on the surface (41*a*) of the insulating layer 41 (the surface of the second layer (4*b*)) and may each be substantially entirely surrounded by the resin part 45 (the second resin part (45*b*)) and substantially entirely embedded in the insulating layer 41 (the second layer (4*b*)). The second inorganic filler particles (5*b*) exposed on the surface (41*a*) of the insulating layer 41 may peel off from the surface (41*a*) of the insulating layer 41 during a roughening treatment or the like. However, even when peeling occurs, since the second inorganic filler particles (5*b*) have particle sizes of about 0.1 μm as described above, it is thought that there is little risk that a deep recess is formed on the surface (41*a*) of the insulating layer 41 due to the peeling.

Further, since the surface roughness of the surface (41*a*) of the insulating layer 41 is small, it is thought that a surface roughness of the conductor layer (3*a*) on the insulating layer 41 side is also relatively small. Therefore, for example, in transmission of a high frequency signal, even when a transmission signal is affected by a skin effect, it is thought that deterioration in transmission characteristics or the like due to a substantial increase in impedance is unlikely to occur.

Resin materials that respectively form the first resin part (45*a*) and the second resin part (45*b*) may be the same or different. The second resin part (45*b*) of the second layer (4*b*) is formed to surround each of the multiple second inorganic filler particles (5*b*) contained in the second layer (4*b*). However, as illustrated in FIG. 2, in a portion of the second layer (4*b*) on which the metal film 31 is formed, a part of the metal film 31 enters between the second resin part (45*b*) and the second inorganic filler particles (5*b*) from the surface of the second layer (4*b*) (the surface (41*a*) of the insulating layer 41).

For example, when the metal film 31 is an electroless plating film formed by electroless plating, the metal film 31 forming the conductor layer (3*a*) is formed on the surface (41*a*) of the insulating layer 41 by electroless plating performed in a plating solution. In this case, a part of the metal film 31 enters between the second resin part (45*b*) and the second inorganic filler particles (5*b*) from the surface (41*a*) of the insulating layer 41, and thereby, the metal film 31 can also be formed in gaps between the second resin part (45*b*) and the second inorganic filler particles (5*b*). That is, a part of the conductor layer (3*a*) (a part of the metal film 31) is formed not only on the surface (41*a*) of the insulating layer 41 but also between the second resin part (45*b*) and the second inorganic filler particles (5*b*). In this way, when the metal film 31 is formed in the gaps between the second resin part (45*b*) and the second inorganic filler particles (5*b*), it is thought that a substantial contact area between the metal film 31 (a part of the conductor layer (3*a*)) and the insulating layer 41 increases. It is thought that the adhesion strength between the metal film 31, that is, the conductor layer (3*a*), and the insulating layer 41 is improved.

That is, in the wiring substrate 100 of the embodiment, the second layer (4*b*) of the insulating layer 41 includes, in a portion on which the metal film 31 is formed, a composite layer (45*d*) that is formed of the metal film 31 (formed between the second inorganic filler particles (5*b*) and the second resin part (45*b*)) and the second resin part (45*b*). That is, in a portion of the second layer (4*b*) on which the metal film 31 is formed, the multiple second inorganic filler particles (5*b*) positioned near the surface of the second layer (4*b*) on the metal film 31 side are each surrounded by the composite layer (45*d*).

An occupancy rate of a part of the metal film 31 that has entered from the surface (41*a*) of the insulating layer 41 in the composite layer (45*d*), that is, a ratio of a part of the metal film 31 to a total of the second resin part (45*b*) and the part of the metal film 31 in the composite layer (45*d*) is about 50% or more and about 75% or less. Preferably, the occupancy rate of the part of the metal film 31 can be about 60% or more. It is thought that good adhesion strength between the metal film 31 and the insulating layer 41 can be obtained.

A thickness of the composite layer (45*d*) is a distance (D) from the surface (41*a*) of the insulating layer 41 to the deepest part of the metal film 31 that has entered from the surface (41*a*) of the insulating layer 41. The "deepest part" means a part, in the entered metal film 31, that is farthest from the surface (41*a*) of the insulating layer 41 in a thickness direction (lamination direction) of the wiring substrate 100. When the metal film 31 has excessively entered from the surface (41*a*) of the insulating layer 41, in patterning the conductor layer (3*a*) in which unwanted portions of the metal film 31 are removed, it may be difficult to remove the metal film 31 in a region where the conductor patterns such as the wiring patterns 30 illustrated in FIG. 1 are not formed. For example, when the gaps between the second resin part (45*b*) and the second inorganic filler particles (5*b*) are too deep, an etching solution that dissolves the metal film 31 may not be able to flow deep into the gaps and the metal film 31 may remain between the second resin part (45*b*) and the second inorganic filler particles (5*b*). When the metal film 31 remains in this way, it is thought that the insulation between the conductor patterns of the conductor layer (3*a*), for example, between adjacent wiring patterns 30, may deteriorate, and, for example, there is a risk that a short circuit failure or the like may occur.

For example, in the present embodiment, the thickness of the composite layer (45*d*) is about 0.1 μm or more and about 0.3 μm or less. This thickness can be obtained by adjusting the distance (D) of the metal film 31 (which has entered from the surface (41*a*) of the insulating layer 41) from the surface (41*a*) of the insulating layer 41, for example, by appropriately selecting plating conditions for forming the metal film 31. When the thickness of the composite layer (45*d*) is at this level, it is thought that residuals of the metal film 31 are unlikely to occur in an etching process. According to the present embodiment, it is thought that adhesion strength between an insulating layer and a conductor layer can be improved while suppressing deterioration in insulation between conductor patterns.

As another example of the insulating layers 4 in the wiring substrate of the present embodiment, as the first inorganic filler particles (5*a*) contained in the first layer (4*a*) of the insulating layer 41, hollow filler particles may be used instead of the inorganic filler particles 5 formed of silica, alumina, or the like, or in addition to the inorganic filler particles 5 formed of silica, alumina, or the like. When the first layer (4*a*) contains a porous material such as hollow filler particles, it may be possible that a further reduction in dielectric constant of the insulating layer 41 can be achieved. As the second inorganic filler particles (5*b*) contained in the second layer (4*b*), since it is thought that adhesion with the insulating layer is stronger, it may be preferable to use the inorganic filler particles 5 formed of silica, alumina, or the like.

Figure 3:
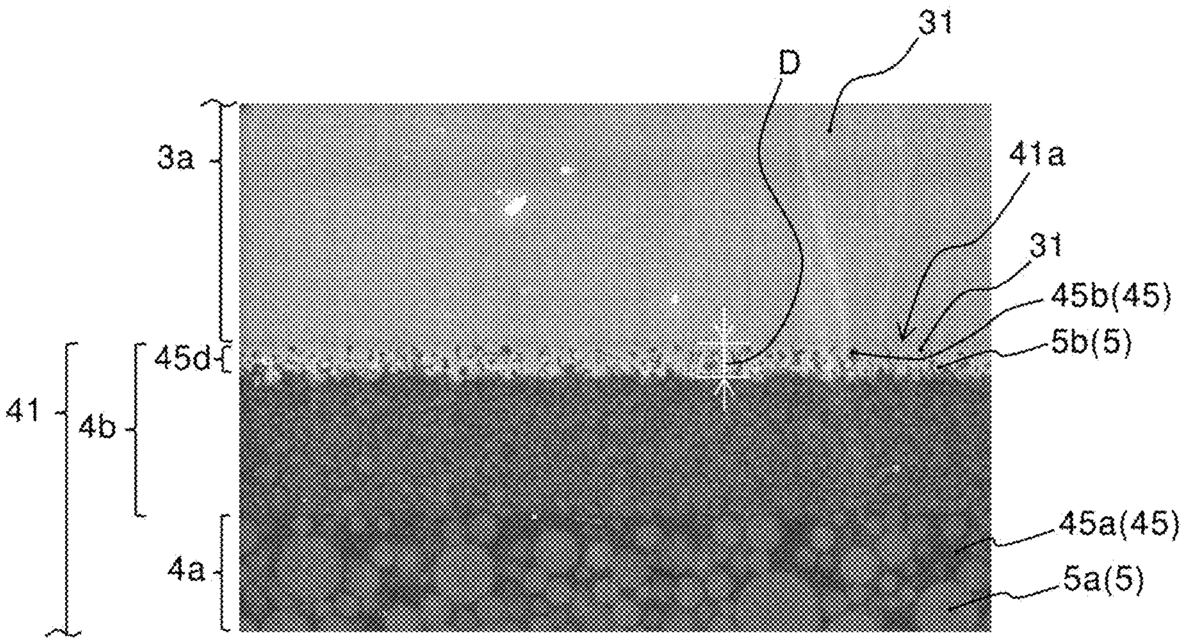
FIG. 3 is a photographed image of a cross section near an interface between an insulating layer and a metal film according to a working example of the present invention.

FIG. 3 shows a photographed image of a cross section near an interface between the insulating layer 41 and the metal film 31 (which forms the conductor layer (3*a*)) in a working example of the wiring substrate of the embodiment.

As shown in FIG. 3, the insulating layer 41 includes the first layer (4*a*) containing the first inorganic filler particles (5*a*) with larger particle sizes and the second layer (4*b*) containing the second inorganic filler particles (5*b*) with smaller particle sizes.

The metal film 31 is also formed between the second inorganic filler particles (5*b*) and the second resin part (45*b*). As shown in the working example of FIG. 3, in the present embodiment, a part of the metal film 31 enters between the second inorganic filler particles (5*b*) and the second resin part (45*b*) of the insulating layer 41. In the present embodiment, the second layer (4*b*) includes the composite layer (45*d*) formed of the metal film 31 (that has entered between the second inorganic filler particles (5*b*) and the second resin part (45*b*)) and the second resin part (45*b*). The thickness of the composite layer (45*d*) is the distance (D) between the deepest part of the metal film 31 (that has entered between the second inorganic filler particles (5*b*) and the second resin part (45*b*) and the surface (41*a*) of the insulating layer 41, and is about 0.1 μm or more and 0.3 μm or less. Therefore, good adhesion strength between the conductor layer (3*a*) (the metal film 31) and the insulating layer 41 and good insulation between the conductor patterns included in the conductor layer (3*a*) can be obtained.

The wiring substrate of the embodiment may be manufactured using a general method for manufacturing a wiring substrate. Each of the insulating layers 4, and the conductor layers 3 that are respectively formed on the insulating layers 4, may be formed, for example, using a general method for manufacturing a build-up substrate. For example, each of the insulating layers and the layers forming the insulating layers 4 may be formed by thermocompression bonding a film-like resin material onto a conductor layer or insulating layer formed earlier. Further, each of the conductor layers may be formed, for example, using any method for forming conductor patterns such as a semi-additive method or a full additive method, including plating resist formation and pattern plating, and the like.

The roughening treatment of the surface (41*a*) of the insulating layer 41 can be performed using a general procedure and under a general condition. However, for example, in a roughening treatment based on an alkaline permanganate solution treatment, a swelling treatment using a swelling liquid, an oxidation treatment using an oxidizing agent (substantial roughening treatment), and a neutralization treatment using a neutralizing liquid can be performed. As the swelling liquid, for example, a sodium hydroxide solution or a potassium hydroxide solution or the like is used, and the insulating layer 41 is exposed to the swelling liquid at a predetermined temperature for a predetermined time. As the oxidizing agent, for example, an alkaline permanganate solution containing permanganate at a predetermined concentration is used, and the insulating layer 41 is exposed to the solution at a predetermined temperature for a predetermined time. As the neutralizing liquid, an acidic aqueous solution is used, and the surface (41*a*) of the insulating layer 41 roughened by the oxidation treatment is exposed to the neutralizing liquid at a predetermined temperature for a predetermined time. For example, conditions such as a treatment time, a temperature of a treatment liquid, and/or a concentration of a main component in the treatment liquid in each treatment during a series of roughening treatments are appropriately selected. As a result, the surface (41*a*) of the insulating layer 41 can be roughened to have the desired arithmetic mean roughness (Ra) described above.

After the roughening of the surface (41*a*) of the insulating layer 41, cleaning may be performed. For example, the wiring substrate during manufacturing is cleaned by ultrasonic cleaning. By ultrasonic cleaning, a state of the surface (41*a*) of the insulating layer 41 may be further brought closer to a desired state. For example, it is possible that excessive second inorganic filler particles (5*b*) on the surface (41*a*) are removed by ultrasonic cleaning and the unevenness (4*u*) is formed.

The wiring substrate of the embodiment is not limited to those having the structures illustrated in the drawings and those having the structures, shapes, and materials exemplified in the present specification. As described above, the wiring substrate of the embodiment can have any laminated structure. The wiring substrate of the embodiment can have any number of conductor layers and any number of insulating layers. The conductor layers 3 do not have to each include a plating film 32 formed of an electrolytic plating film, and may include, for example, only the metal film 31 formed of an electroless plating film. An insulating layer 4, on a surface of which the conductor layer (3*a*) is not formed, may have a two-layer structure, or the insulating layer 41 may include layers other than the first and second layers.

Japanese Patent Application Laid-Open Publication No. 2006-45388 describes an insulating adhesive sheet in which a content (x) of inorganic filler particles present in a surface layer (X) on one side and a content (y) of inorganic filler particles present in a surface layer (Y) on the other side satisfy a relationship of $x<y$. A metal layer is formed on the surface with the surface layer (X). The inorganic filler particles are added to the surface layer (X) to an extent that the inorganic filler particles are not exposed on the surface.

In the insulating adhesive sheet described in Japanese Patent Application Laid-Open Publication No. 2006-45388, high adhesion between the insulating adhesive sheet and the metal layer and low dielectric loss tangent of the insulating adhesive sheet may not be sufficiently compatible.

A wiring substrate according to an embodiment of the present invention includes an insulating layer and a conductor layer. The insulating layer includes a first layer that contains multiple first inorganic filler particles and a first resin part surrounding each of the multiple first inorganic filler particles, and a second layer that contains multiple second inorganic filler particles and a second resin part surrounding each of the multiple second inorganic filler particles, and contains the multiple second inorganic filler particles at a content rate lower than a content rate of the multiple first inorganic filler particles in the first layer. The conductor layer includes a metal film formed on a surface of the second layer and includes predetermined conductor patterns. A thickness of the first layer is 90% or more of a thickness of the insulating layer. The second layer includes a composite layer that is formed of a part of the metal film, which has entered between the second inorganic filler particles and the second resin part, and the second resin part. The composite layer has a thickness of 0.1 μm or more and 0.3 μm or less.

According to an embodiment of the present invention, it is possible to realize fine pitch wirings with improved adhesion strength to an insulating layer and to achieve a low dielectric loss tangent.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:

an insulating layer comprising a first layer and a second layer; and a conductor layer comprising a metal film formed on a surface of the second layer of the insulating layer such that the conductor layer includes a conductor pattern, wherein the insulating layer is formed such that the surface of the second layer has an arithmetic mean roughness Ra in a range of 0.05 μm to 0.15 μm, that the first layer includes resin and first inorganic particles, that the second layer includes resin and second inorganic particles at a content rate that is lower than a content rate of the first inorganic particles in the first layer, and that a thickness of the first layer is 90% or more of a thickness of the insulating layer, and the second layer of the insulating layer is formed such that the second layer includes a composite layer portion having a thickness in a range of 0.1 μm to 0.3 μm and that the composite layer portion includes part of the metal film in the conductor layer formed in gaps between the second inorganic particles and the resin in the second layer.

2. The wiring substrate according to claim 1, wherein the second layer of the insulating layer is formed such that the part of the metal film in the composite layer has an occupancy rate of 60% or more.

3. The wiring substrate according to claim 2, wherein the conductor layer is formed such that the conductor pattern has a plurality of wiring patterns having a minimum wiring interval in a range of 5 μm to 12 μm.

4. The wiring substrate according to claim 3, wherein the conductor layer is formed such that a minimum wiring width of the wiring patterns is in a range of 5 μm to 9 μm.

5. The wiring substrate according to claim 2, wherein the conductor layer is formed such that the metal film includes an electroless plating film.

6. The wiring substrate according to claim 2, wherein the insulating layer is formed such that the content rate of the first inorganic particles in the first layer is in a range of 70% to 95% and that the content rate of the second inorganic particles in the second layer is in a range of 40% to 65%.

7. The wiring substrate according to claim 2, wherein the insulating layer is formed such that the first inorganic particles include hollow filler particles.

8. The wiring substrate according to claim 1, wherein the conductor layer is formed such that the conductor pattern has a plurality of wiring patterns having a minimum wiring interval in a range of 5 μm to 12 μm.

9. The wiring substrate according to claim 8, wherein the conductor layer is formed such that a minimum wiring width of the wiring patterns is in a range of 5 μm to 9 μm.

10. The wiring substrate according to claim 9, wherein the conductor layer is formed such that the metal film includes an electroless plating film.

11. The wiring substrate according to claim 8, wherein the conductor layer is formed such that the metal film includes an electroless plating film.

12. The wiring substrate according to claim 8, wherein the insulating layer is formed such that the content rate of the first inorganic particles in the first layer is in a range of 70% to 95% and that the content rate of the second inorganic particles in the second layer is in a range of 40% to 65%.

13. The wiring substrate according to claim 9, wherein the insulating layer is formed such that the content rate of the first inorganic particles in the first layer is in a range of 70% to 95% and that the content rate of the second inorganic particles in the second layer is in a range of 40% to 65%.

14. The wiring substrate according to claim 8, wherein the insulating layer is formed such that the first inorganic particles include hollow filler particles.

15. The wiring substrate according to claim 1, wherein the conductor layer is formed such that the metal film includes an electroless plating film.

16. The wiring substrate according to claim 15, wherein the insulating layer is formed such that the content rate of the first inorganic particles in the first layer is in a range of 70% to 95% and that the content rate of the second inorganic particles in the second layer is in a range of 40% to 65%.

17. The wiring substrate according to claim 15, wherein the insulating layer is formed such that the first inorganic particles include hollow filler particles.

18. The wiring substrate according to claim 1, wherein the insulating layer is formed such that the content rate of the first inorganic particles in the first layer is in a range of 70% to 95% and that the content rate of the second inorganic particles in the second layer is in a range of 40% to 65%.

19. The wiring substrate according to claim 18, wherein the insulating layer is formed such that the first inorganic particles include hollow filler particles.

20. The wiring substrate according to claim 1, wherein the insulating layer is formed such that the first inorganic particles include hollow filler particles.

* * * * *